United States Patent
Carroll et al.

[11] Patent Number: 6,160,578
[45] Date of Patent: Dec. 12, 2000

[54] HIGH SPEED, INCREASED BANDWIDTH CAMERA

[75] Inventors: Gus F. Carroll, Los Gatos; Galen Collins, San Jose, both of Calif.

[73] Assignee: Redlake Imaging Corporation, Morgan Hill, Calif.

[21] Appl. No.: 09/099,910

[22] Filed: Jun. 18, 1998

[51] Int. Cl.$^7$ ............................. H04N 5/228; H04N 9/64; H04N 3/14

[52] U.S. Cl. ................................ 348/222; 34/248; 34/312

[58] Field of Search ...................................... 348/312, 222, 348/241, 243, 246, 248, 249, 266, 272, 271, 277, 321, 323; 327/165; 358/463, 482, 483

[56] References Cited

U.S. PATENT DOCUMENTS

| | | | |
|---|---|---|---|
| 4,498,106 | 2/1985 | Sato et al. .................................. | 348/312 |
| 5,153,732 | 10/1992 | Oda et al. ................................ | 348/248 |
| 5,307,158 | 4/1994 | Tsuruta et al. ........................... | 348/312 |
| 5,583,567 | 12/1996 | Nagasawa et al. ...................... | 348/266 |
| 5,696,554 | 12/1997 | Hwang ..................................... | 348/241 |

*Primary Examiner*—Wendy Garber
*Assistant Examiner*—Luong Nguyen
*Attorney, Agent, or Firm*—Allston L. Jones

[57] ABSTRACT

Many improvements for a high speed camera including being able to process image data from a CCD array at one-quarter the pixel rate at which that image is provided by the CCD array; automatically demultiplexing color information in the digital domain; a high frequency, temperature compensated phase shift clock circuit to individually adjust the phase of the clock signal to each A/D converter; high frequency, high power analog, bipolar clock drivers to drive the horizontal functions of the CCD array since the necessary speed and power is not available in the horizontal driver section of commercially available CCD drivers; a technique to minimize the smearing of partial values of previous pixels into later pixels since the CCD array is being clocked faster than the internal time constant of the output stage of the CCD array; determination of, and compensation for, the dark reference (i.e., black level) offset of the pixel data streams from the CCD array; and subtracting the dark reference offset from the data pixel signal stream from the CCD array to stabilize the operating point of the output amplifier following the CCD array.

18 Claims, 8 Drawing Sheets

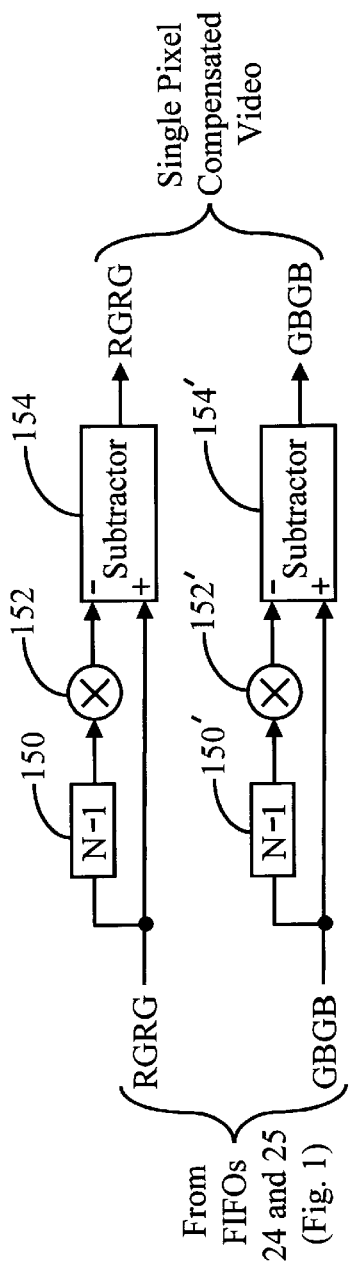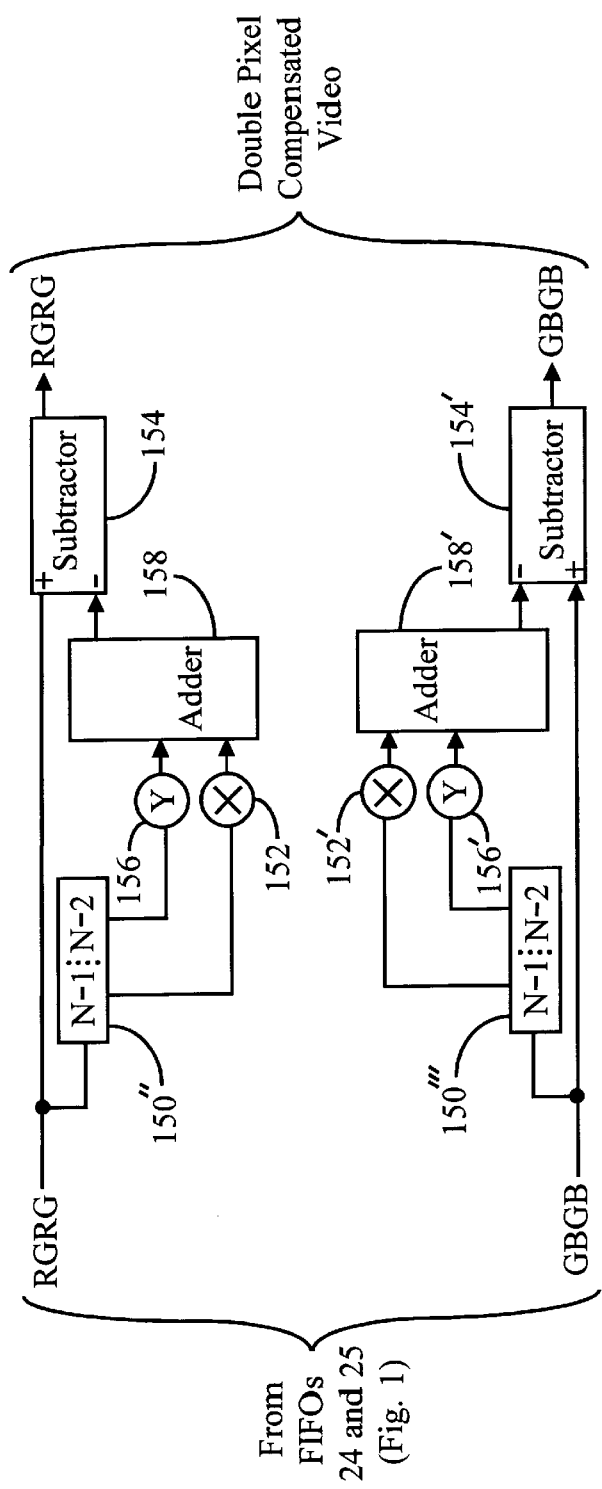

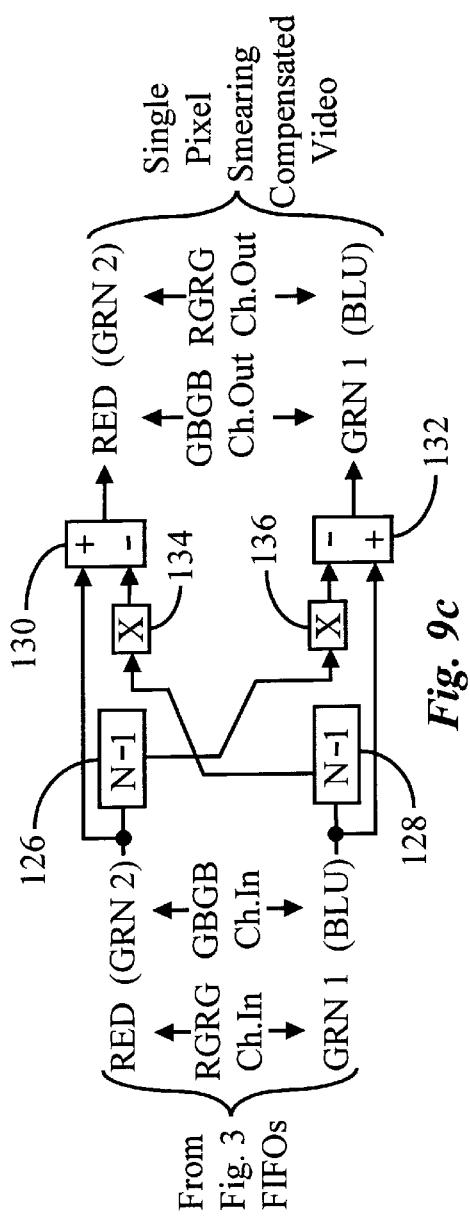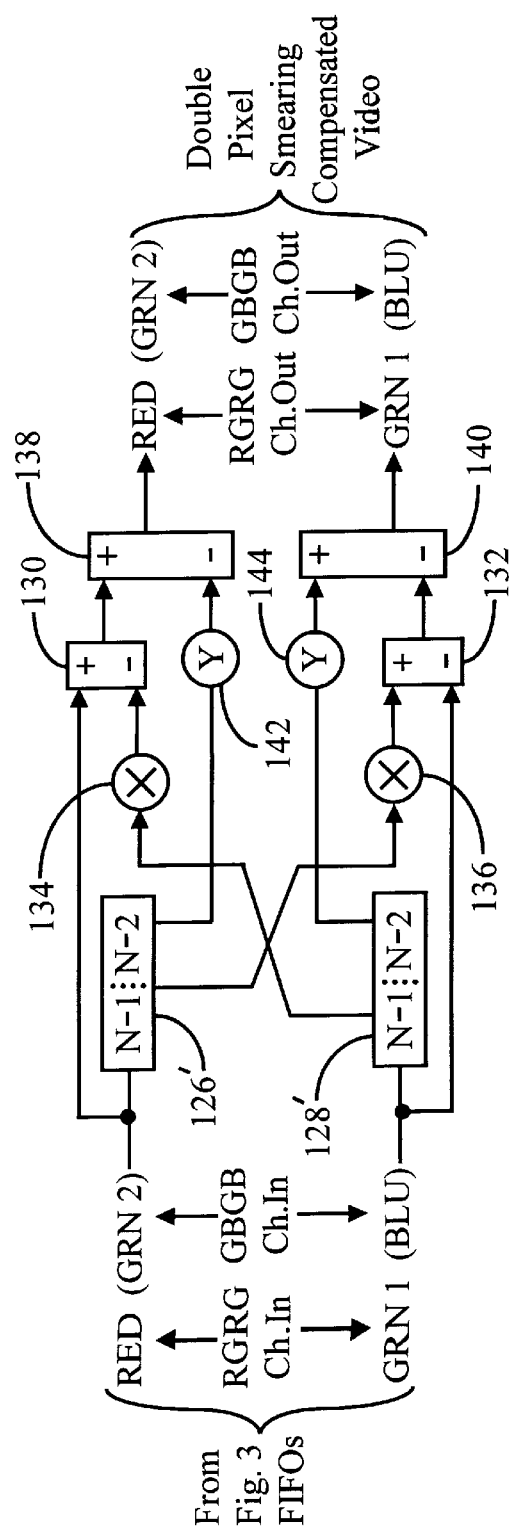

HIGH SPEED, INCREASED BANDWIDTH CAMERA

FIELD OF THE INVENTION

The present invention is a digital camera, more specifically a very high speed camera that can be used to stop action of events that occur at very high speeds.

BACKGROUND OF THE INVENTION

Historically high speed electronic cameras have used an imager that has a multitude of parallel outputs, or channels (e.g., 16, 32, or even 256 or more channels with one for each line in the display), to increase the effective bandwidth of the camera. In such implementations, each channel requires duplicate electronic circuits that run at the same nominal video rate. Eventually, all of the channels have to be recombined to display the final image.

There are many drawbacks to such implementations. One is the need for special imagers (rather than off-the-shelf) having many output channels, which dramatically increases the price since such imagers may cost 50 times as much as an off the shelf two channel imager. A second is the increased costs for the additional components especially as higher and higher bandwidths are desired. A third is the labor intensive problem of correcting the imbalance in outputs of the large number of channels resulting from tolerances of the various elements used in each channel. With higher and higher speeds in electronic cameras, the differences between the various channels, even slight differences, contribute more and more to undesirable visual effects in the displayed images presented by those cameras.

It would be desirable to have a fast electronic camera (i.e., high frame rate with shuttering capability) with few channels that can provide improved image resolution at low cost with a few high speed, high cost electronic components in combination with a low cost imager in lieu of many low cost electronic components and a high cost imager as in the prior art. To provide that advantage it would be desirable to multiplex the higher cost components to provide an increased effective bandwidth while using low cost components without having to correct imbalance. The present invention provides such a camera.

SUMMARY OF THE INVENTION

The present invention provides a high speed camera with various method, computer-implementable method and apparatus improvements to a previous high speed camera design while enabling higher resolution and use of low speed components, resulting in a high speed camera that provides high speed processing while keeping component costs low.

One such improvement is a high speed camera capable of processing image data from a two channel CCD array at one-quarter the pixel rate at which that image is provided by the CCD array. Each channel is clocked at a selected frequency to achieve a total pixel rate provided by the CCD array of twice the selected frequency. Then, simultaneously and independently two analog to digital conversions are performed on the image data signal from each channel of the CCD array (four A/D conversions) with one conversion on each data signal being performed on the rising edge of a half frequency signal (half the frequency of the selected signal) and the second conversion being performed on the falling edge of the half frequency signal to produce four pixel data signals of the image at one quarter the pixel rate of the overall image data from the CCD array, thus allowing the use of components capable of operating at half the frequency at which the CCD is clocked.

An added benefit to this method is that the data signals from the two channels are automatically demultiplexed with the individual color pixels being in digital form. This results from one channel of the CCD array providing a RGRG data signal of the image with the analog to digital conversion splitting that signal into a RED data signal and a GRN1 data signal. Similarly, the other channel of the CCD array provides a GBGB data signal of the image with the analog to digital conversion splitting the GBGB data signal into a GRN2 data signal and a BLU data signal.

Working at the high frequency at which the camera of the present invention is intended requires that a variable phase shift circuit be used to clock each of the A/D converters to process the signals from any CCD array. The use of a programable phase shift is necessary to finely adjust the clock pulses to the A/Ds to assure that sampling occurs at the peak of each signal. This is true at higher frequencies independent of the number of channels of the CCD array. For the particular circuit configuration discussed above, four phase shift circuits are needed, one for each A/D converter. The present invention also presents a high speed, temperature compensated phase shift circuit based on the half frequency signal for that purpose. That circuit includes a feedforward path and a feedback path. In the feedforward path there is a voltage variable, active filter, delay circuit coupled to receive and selectively delay the half frequency clock signal. From the active filter the clock signal is converted by a differential to TTL level translator to a TTL sample clock signal selectively delayed from the half frequency clock signal with said sample clock signal being disposed to be applied to a corresponding one of the four A/D converters as a clock signal. The feed back path includes an exclusive NOR gate having one input terminal coupled to receive the sample clock from said differential to TTL level translator and a second input terminal coupled to the input of the active filter delay circuit to produce a signal that is proportional to the phase difference between the half frequency clock and sample clock signals, together with the polarity of that difference. This difference signal is integrated to provide an analog signal that is proportional to the phase difference. Additionally, there is a D/A converter coupled to the control subsystem of the camera to receive a signal corresponding to the desired phase shift of a particular variable phase shifter circuit and convert that phase shift signal to an analog signal. Finally, there is an operational amplifier coupled to receive the analog difference signal from the integrator and the said analog phase shift signal from the D/A converter, and coupled to the active filter delay circuit to create a voltage feedback signal that adjusts the phase delay presented by the variable phase shifter circuit.

There are several other features of the present invention that are needed due to the high frequency at which the CCD array is being clocked, and which are independent of how many channels the CCD array has, or the actual configuration of the camera. One of those is a pair of analog, bipolar clock drivers to drive the horizontal functions of the CCD array since the necessary speed and power is not available in the horizontal driver section of commercially available CCD drivers. The horizontal drivers of the present invention include a high frequency bipolar buffer stage coupled to receive a corresponding control signal from the control subsystem of the camera, a plurality of capacitors coupled to the buffer stage to compensate for parasitic capacitance, high frequency bipolar NPN and PNP transistors connected in a push-pull arrangement with bases coupled to the buffer stage and emitters coupled to a corresponding interactive terminal of the CCD array, and an R-L network coupled between the combined bases and the collector of one of the NPN and PNP transistors to speed up the transitions of the transistors in the push-pull arrangement. Additionally, signal voltage level shifting diodes to define the minimum and maximum signal levels from the buffer stage to match operational signal levels of the CCD array could be included if needed.

In the design of the present invention, the high frequency CCD arrays are clocked faster than the internal time constant of the output reset stage of the CCD array resulting in each output data pixel of the image containing a contribution from a previous data pixel of the image. The present invention provides a method and apparatus to minimize the residual effect of the previous data pixel on a current data pixel in the data pixel signal stream. This is accomplished by first converting the data pixel signal stream to a digital pixel stream with the digital pixel stream next delayed by a time equivalent to two pixel time periods. Then a value of the previous pixel is multiplied by a preselected factor having a value of less than one to obtain a fractional value of the previous pixel which is subtracted from the value of the current data pixel to obtain a compensated value for the current pixel. This process is thus repeated for all of the pixels in the data stream to compensate for the smearing effect.

As the clocking speed is increased, the smearing effect is more severe. Additional previous pixel values can be multiplied by progressively smaller factors with the reduced values of two, three, etc. previous pixels all subtracted from the value of the current pixel.

Another feature of the present invention utilizing the digitized pixel data signals of the camera is the determination of, and compensation for, the dark reference (i.e., black level) offset of the pixel data streams from the CCD array. To perform that function the pixel data from the dark reference image area of the CCD array is used to determine and remove an average dark reference level from the data pixels originating from the active image receiving area of the CCD array. As in the other embodiments of the present invention, the data signals from the CCD array are first applied to an A/D converter to convert those signals to digital pixels since the dark reference determination is performed in the digital domain in the present invention.

Next the average value of a selected number of the dark reference pixels from the digital pixel stream for the same image line are subtracted from the level of each active image pixel. This process is performed on the pixel data for each line of the image.

Another technique to further improve the performance of the high speed camera of the present invention is to convert the average dark reference level to an analog offset signal, which is used to hold the DC level of the output operational amplifier from the corresponding channel of the CCD array constant. This provides two advantages: one is to keep the operational amplifier on the output of the CCD array from going into saturation; an other is to maximize the usable input dynamic range of components that follow the CCD array.

BRIEF DESCRIPTION OF THE FIGURES

FIG. 2b is a schematic representation of a high frequency horizontal CCD power driver for use in the present invention as in FIG. 2a.

FIG. 6 is a representative an analog video signal from the CCD imager array of FIGS. 1 and 2a.

FIG. 9a is a block diagram that illustrates single pixel smearing compensation for the implementation of FIG. 1 that includes two A/D converters.

FIG. 9b is a block diagram that illustrates double pixel smearing compensation for the implementation of FIG. 1 that includes two A/D converters.

FIG. 9c is a block diagram that illustrates single pixel smearing compensation for the embodiment of FIG. 3 that includes four A/D converters.

FIG. 9d is a block diagram that illustrates double pixel smearing compensation for the embodiment of FIG. 3 that includes four A/D converters.

DETAILED DESCRIPTION OF THE PREFERRED EMBODIMENTS

Figure 1:
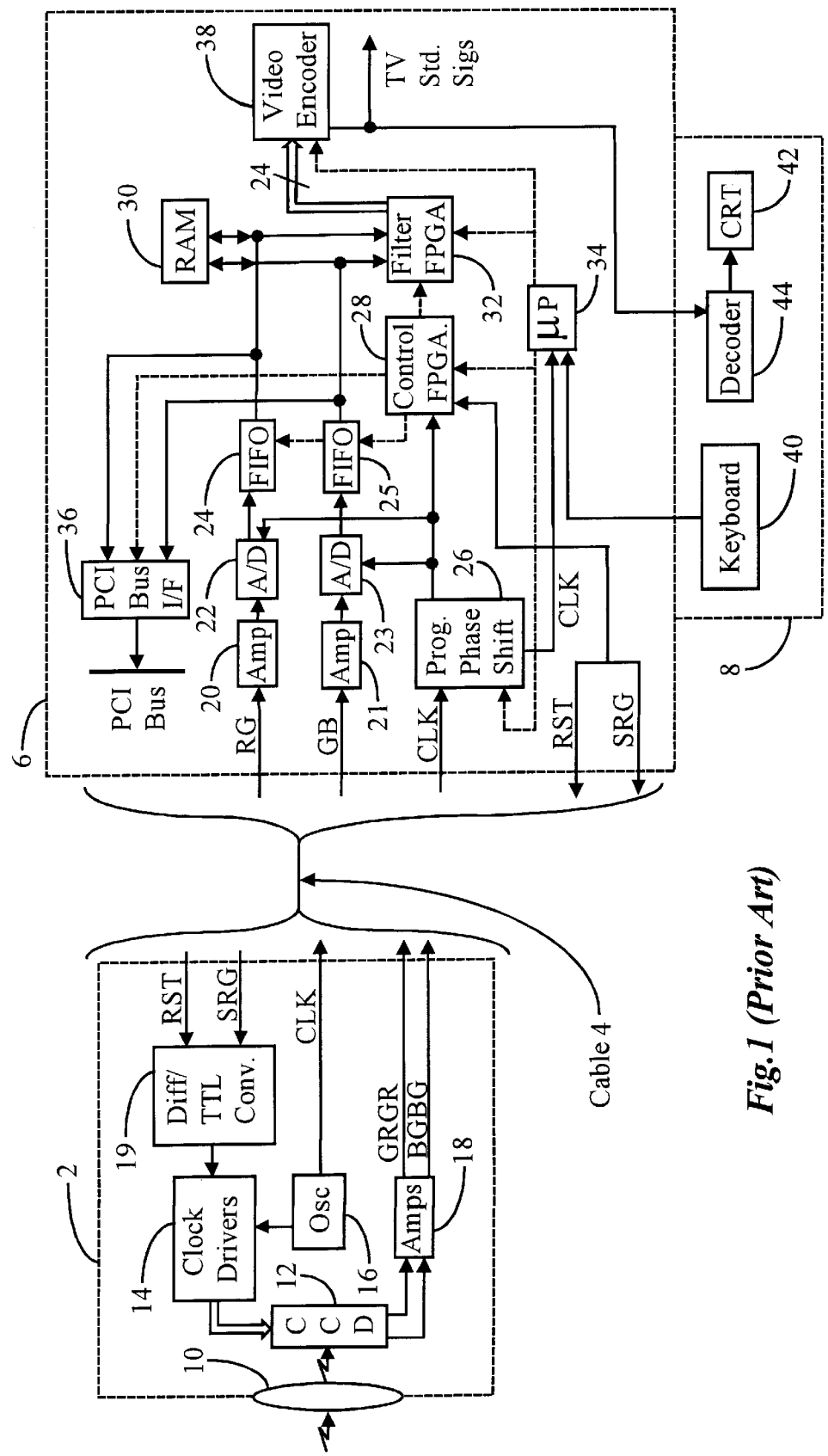
FIG. 1 is a block diagram representation of the high speed camera system of the prior art.

FIG. 1 presents a block diagram of an earlier version of a two channel high speed camera system. The overall system concept of that earlier version carries over into the camera system of the present invention that runs faster than that earlier version. As discussed below, the present invention incorporates numerous dramatic changes that permit the camera system of the present invention to run at twice the speed of the earlier version of the camera. To best understand the present invention, the prior version of the two channel high speed camera is discussed first. The earlier version of the camera system runs at a 32 Mpixel/sec. rate per channel (64 Mpixels/sec. overall), whereas the camera system of the present invention runs at a 64 Mpixel/sec. rate per channel (128 Mpixels/sec. overall) with that being achieved through the improvements that are discussed below that allow for the doubling of the pixel rate while still permitting the use of the majority of the lower cost components used by the earlier version of the camera system.

Initially there is presented an operational overview of the previous version of the camera having the basic architecture shown in FIG. 1. A camera as in FIG. 1 consists of four component structures: camera head module 2; bidirectional interconnection cable 4; control subsystem 6; and a user interface 8. For convenience, and to permit the camera head module 2 to be as small as possible, the number of components within that module is limited with the camera head being connected to the control subsystem via bidirectional cable 4 which carries data and control signals in both directions, as well as DC power from the control subsystem to camera head module 2.

Camera head module 2 includes a lens system 10 that focuses the desired image on a two channel CCD imager array 12 (e.g., TC236). Providing the necessary clock, or control, signals to CCD array 12 are clock drivers 14 (e.g., a pair of TMC57253 chips connected in parallel) which in turn receive those several control signals from differential/

TTL converter 19 having received differential logic signals from control subsystem 6 via twisted pairs in cable 4 (including RST and SRG shown in FIG. 1 and discussed more fully below). Thus, differential/TTL converter 19 converts the differential control signals received via twisted pair to standard TTL signals before applying those signals to clock drivers 14. Clock drivers 14 then use the control signals to convert them into the power clock signals that are needed to drive CCD array 12 with timing provided by oscillator 16 which operates at a 32 MHZ rate.

As will be seen in the discussion that follows with respect to the operation of control subsystem 6, oscillator 16 is the master clock for the entire camera system. Oscillator 16 is located in camera head 2 since the location of clock edges is most critical in the definition of the clock signals that are applied to CCD array 12, i.e., the capturing of the image is the most critical timing operation of the camera. Once the image is captured, provision is made in the downstream circuits to reposition the various clock edges as is discussed below. Further, as can be appreciated, if a master clock signal were sent through cable 4, given the length and potential interaction with other signals being carried by that cable, the edges of a master clock signal at the opposite end of cable 4 in such an environment could become altered. Additionally, 32 MHZ was selected in the previous system, and is also used in a portion of the present invention, since that frequency is approaching the bandwidth limit of many of the components used in both camera head 2 and control subsystem 6.

Coming from CCD array 12, in response to the image from lens system 10 and the clock driver signals, is a pair of video signals (GBGB [green-blue-green-blue] and RGRG [red-green-red-green] in a color implementation, and two monochrome channels in a black and white implementation), one from each channel, that are very small in amplitude, thus they are directed to amplifiers 18 to be amplified before being applied to cable 4 for transmission to control subsystem 6. The clock signal (CLK) from oscillator 16 is also sent across cable 4 to control subsystem 6.

Locating oscillator 16 in camera head 2 allows transmission of the actual clock signal that was used to generate the video signals to control subsystem 6, via cable 4, together with the video signals so that all of the clock edges agree at the point in time that the video signals are applied to cable 4. Thus, when those signals arrive at control subsystem 6, the video and clock signal edges are much closer in time to each other than they would have been if the clock had been generated in control subsystem 6 and transmitted to camera head 2. Even with this approach the clock edges and video signals are not related closely enough for proper image capture due to cross-talk between various wires in cable 4, the length of cable 4, and the length of traces on the PC boards of camera head 2 and control subsystem 6, each of which can have a differing phase shift effect on the clock signal and each of the video signals.

In any design, a CCD array typically requires many different clock signals. For example, the CCD array being used in both the previous and present invention camera designs needs one clock signal to move the image down, another clock signal to move the stored image down, still another clock signal for shuttering the array, yet another clock signal to move the image horizontally and still another clock signal to reset the output buffer of each channel of CCD array 12 after every pixel. The two clock signals performing horizontal functions have the same frequency as each other. Similarly, all of the clock signals performing vertical functions also have the same frequency as each other, however, the clock frequency at which the vertical functions are performed is lower than the clock frequency at which the horizontal functions are performed. The vertical functions present a very heavy load since each vertical clock signal must move all of the image pixels together in parallel, whereas the horizontal functions present a much lighter load since each horizontal clock signal is moving only one line of pixels each time instead of the entire image. Thus, the horizontal functions can be driven much faster. In the previous design, two clock driver chips (TMC57253) were connected in parallel to provide enough current to accomplish the high speed horizontal switching. However, in that design the horizontal drivers in those chips are being run at, or near, the operational limit.

Control subsystem 6 receives the video signals (GRGR and BGBG) and the clock signal (CLK) as input signals to amplifiers 20 and 21, and programable phase shifter 26, respectively. Amplifiers 20 and 21 are similar to amplifiers 18 in camera head 2 and are provided to compensate for signal strength lost by the video signals in cable 4 (i.e., the longer cable 4, the higher the gain of amplifiers 20 and 21), as well as to buffer the inputs of A/D converters 22 and 23 with a low impedance. From amplifiers 20 and 21, the amplified video signals are applied to A/D converters 22 and 23, respectfully, to convert the analog video signals to digital video signals.

CCD array 12 produces two output signals, so there are two channels of video data being processed simultaneously throughout the various elements of the camera before the final processed image is presented to the user in any of the output image subsystems. From A/Ds 22 and 23 the corresponding digital video signals are applied to FIFOs (First In First Out) memories 24 and 25, respectively. In turn, FIFOs 24 and 25 provide the corresponding digital video signal to several additional components in control subsystem 6. These include RAM 30, filter FPGA (Field Programable Gate Array) 32 and a PCI bus interface 36. PCI bus interface 36 is optional and is provided in those camera systems where the user wants to utilize the images in another system that contains a PCI bus (e.g., a PC or network). In both the previous and present invention camera designs, filter FPGA 32 is programed to perform various functions on the digital video data under control of microprocessor 34 (e.g., 68Hc11) and control FPGA 28. The video signals are received by filter FPGA 32 either directly from FIFOs 24 and 25, or from RAM 30 depending on the time necessary for filter FPGA 32 to perform various tasks assigned to it. From filter FPGA 32 the video data, having been packetized into 24 bit words, are transferred via a parallel bus to video encoder 38 where the video data is converted to world standard TV signals. Those standardized TV video signals are then available to the user directly, or they are provided to user interface 8. Additionally, control FPGA 28 provides the control signals, including RST and SRG, to clock drivers 14 via twisted pairs in cable 4 and differential/TTL converter 19 in camera head 2.

Microprocessor 34 controls each functional block, makes the image smaller or larger, and performs other functions. Microprocessor 34 also controls control FPGA 28 which in turn controls FIFOs 24 and 25 and PCI bus interface 36.

As stated above, the clock signal transitions often have moved relative to corresponding positions in the video signals (RGRG and GBGB) on the control subsystem 6 side of cable 4 with this repositioning being substantially due to the construction of cable 4, the relative position of each wire or cable within cable 4, as well as the length of cable 4. To correct for that phase shift of the clock edges, programable phase shifter 26 is provided to reposition those clock edges so that the video image can be reconstructed in control subsystem 6. Since this movement of clock edges is substantially related to the individual cable, programmable phase shifter 26 needs only to be programmed, or reprogrammed, whenever cable 4 is changed. This adjustment of clock signal edges in control subsystem 6 is necessary since the video bit rate is fast and the video signal that control subsystem 6 is trying to snag is a very narrow peak. Accordingly, the clock edge must occur at the same point in time as does the video pulse or else the video image cannot be recovered and no image appears at any of the output points of the system.

The adjusted clock signals from programable phase shifter 26 are then applied to A/D converters 22 and 23, and control FPGA 28. The realigned clock signal edges when applied to A/D converters 22 and 23 cause the digitization of the video signals to occur synchronously at each peak.

Since no two cables, even those of the same length, are exactly the same, programable phase shifter 26 cannot be automatically programed, and therefore must be programed manually each time the cable is changed. This is typically done at the factory and is performed visually by an operator watching the image on CRT 42 and varying the program setting of programable phase shifter 26 by controlling microprocessor 34 via keyboard 40. This procedure is the same for both the camera system of the previous design, as well as those that include the features of the present invention.

The basic difference between the camera system of the previous design and that of the present invention is that in the present invention camera system the video pixel rate from the CCD imager array is 64 Mpixel/sec. per channel (128 Mpixels/sec. overall), as opposed to 32 Mpixel/sec. per channel (64 Mpixels/sec. overall) of the prior design, while using double the oscillator 16 clock rate (64 MHz) to capture the image in camera head 2 and still maintain the same clock rate (32 MHz) for the digital components in control subsystem 6. One of the unique things about the present invention is the ability to double the pixel rate while maintaining the same digital component clock rate. It is necessary to maintain the same clock rate for the digital components so that the majority of the digital components can be of the inexpensive type since 32 MHz is substantially the fastest that those components as used in the previous design camera system will operate. To accomplish the doubling of the video speed of the camera of FIG. 1, several of the blocks must be implemented in different ways than they are currently implemented in the previous design camera.

One of those necessary changes is the substitution of a 64 MHz clock for oscillator 16 and the implementation of clock drivers 14. As discussed above, in the prior art design clock drivers 14 were implemented with two TMC57253 CCD driver chips connected in parallel to generate more drive current to perform the horizontal functions, with the input signal to the chips being a TTL signal (0–5 V) and the output signals that are applied to CCD array 12 being CMOS signals (12 Vp-p). That being the case, the drivers of TMC57253 are in essence power drivers.

Figure 2A:
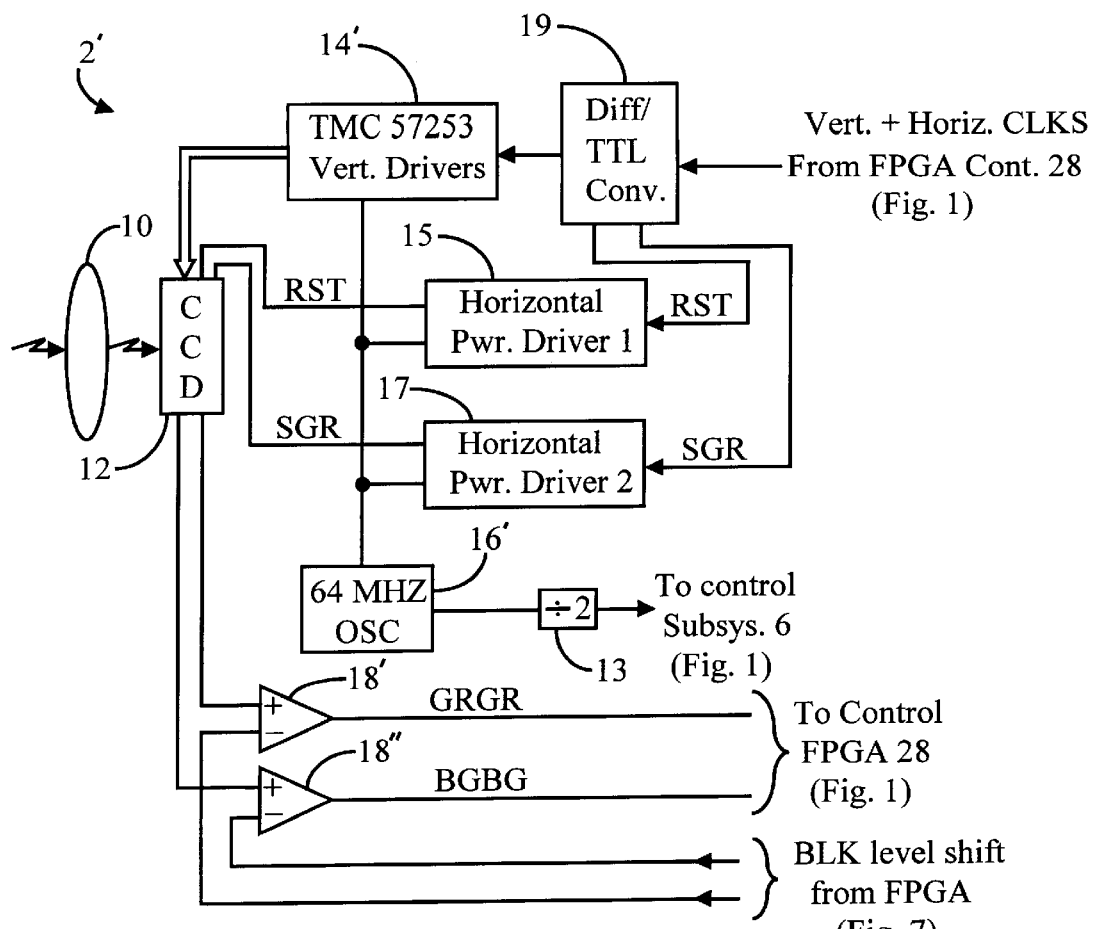
FIG. 2a is a block diagram of the implementation of the camera head module of the present invention.

FIG. 2a is a block diagram of the implementation of camera head module 2' of the present invention. Here oscillator 16' is a 64 MHz clock. Here, the vertical drivers for CCD array 12 are implemented with a single TMC57253 driver 14' that receives the vertical clock signals from control FPGA 28 via differential to TTL converter 19'. This implementation of the vertical drivers is possible since less power is required for the vertical drivers, thus the present application remains within the bandwidth of the TMC57253 vertical drive circuits even with the doubling of the clock speed. However, for the horizontal drivers of the TMC57253, the doubling of the clock speed does exceed the available bandwidth of that chip even if multiple TMC57253 driver chips are connected in parallel. Thus, the horizontal channels of the TCM57253 chip are not used in the present implementation, and two identical discrete high speed/high power driver circuits 15 and 17 are used to power the horizontal Reset (RST) and Serial Register Gate (SRG) signals needed by CCD array 12 to perform the horizontal shifting functions with the RST and SRG signals from FPGA control 28 being received via differential/TTL converter 19. TC236 CCD arrays require these two signals, RST and SRG, and those are the two that have to run at the full pixel rate of 64 Mpixel/sec. in the present invention. Additionally, FIG. 2a shows a frequency divider 13 coupled to 64 MHz oscillator 16' to divide the frequency by 2 to provide a 32 MHz clock signal to control subsystem 6, and amplifiers 18 of FIG. 1 implemented as two separate operational amplifiers 18' and 18" with their operation discussed in more detail below. Note that the RST and SRG signals can alternatively be generated elsewhere in the camera system (e.g., by an FPGA could be located in camera head 2).

The reason that the two horizontal driver stages of a TCM57253 chip can not be used in the implementation of the present invention is a function of the basic design of that chip and the CCD arrays with which it is designed to interface. The drivers that perform the vertical functions are typically operating into a 4000 pfd capacitance load, where as the horizontal drivers are typically operating into a 10–70 pfd load, thus the vertical drivers in the TCM57253 chip are designed to be very powerful but not that fast, and conversely the horizontal drivers are designed to be fast but not that powerful. Thus, in the present invention, the two horizontal drivers of conventional clock driver chips, such as TCM57253, can not be used due to the slow rise and fall times and long delay times.

Figure 2B:
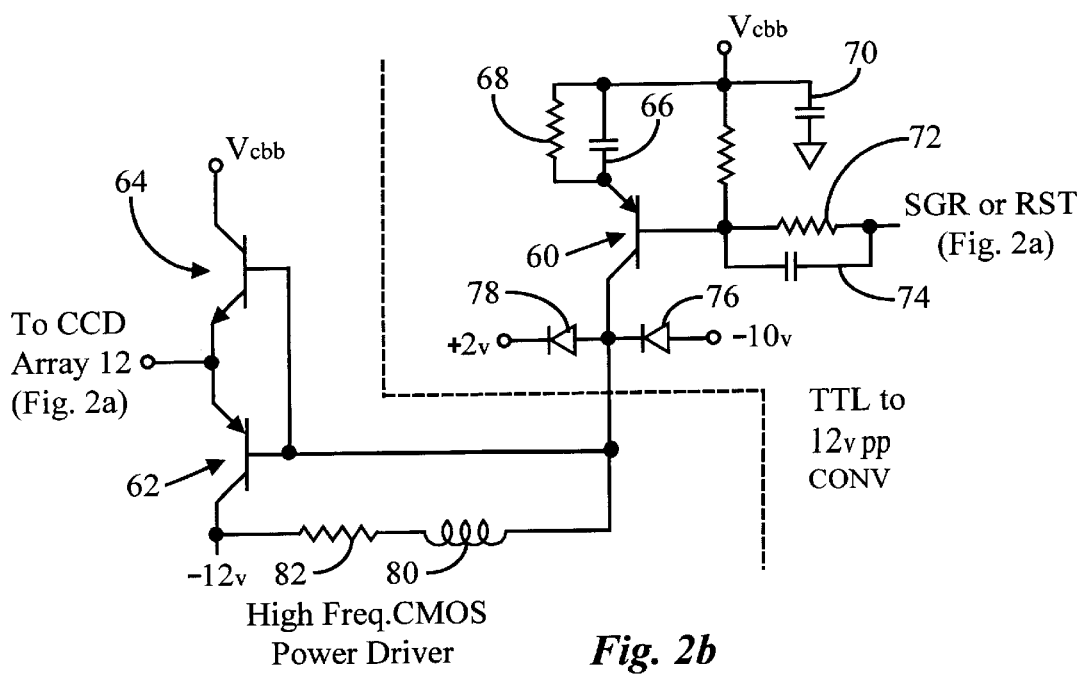

Thus the discrete circuit of FIG. 2b was designed for horizontal power drivers 15 and 17 of FIG. 2a utilizing high frequency bipolar transistors to produce the needed level shifter/clock driver having good edge times while working at 64 MHz. A separate combined voltage shifter and high frequency power driver of the type shown in FIG. 2b is used for each of the RST and SRG horizontal gate clocks of CCD array 12. As shown in FIG. 2b, on the right side the input signal for either the RST or SRG function is received from control FPGA 28 via a twisted pair of wires in cable 4 and differential to TTL Converter 19. That received signal first undergoes a TTL to: 12 Vp-p level shift (since CCD array 12 is a CMOS device) by applying the control signal to the base of positively biased PNP transistor 60 and the clamping diodes 76 and 78 connected to the collector of transistor 60. Following the voltage level shift, the level shifted control signal from diodes 76 and 78 is applied to a pair of high frequency transistors 62 and 64 connected in a push-pull driver circuit arrangement with the power clock signal being delivered to the RST or SRG inputs of CCD array 12 from the connected emitters of transistors 62 and 64. In both stages of the power driver of FIG. 2b, the transistors are not driven into saturation to insure the rapid switching times needed. A circuit of this design is capable of charging and discharging a capacitance of about 75 pf over the full voltage excursion with a rise and fall time of about 2 nsec. at the 64 MHz rate.

The level shifting portion of the circuit of FIG. 2b also includes capacitor 74 connected in parallel with resistor 72 with both connected in series with the base of transistor 60. These components are provided to overcome the parasitic capacitance of transistor 60 at 64 MHz which otherwise would slow down transistor 60. Additionally, emitter capacitor 66 increases the current on the signal to help transistor 60 turn on and off at the 64 MHz rate. Additionally, there is a series resistor 82 and inductor 80 circuit connected between the base of the push-pull transistors 62 and 64 and the negative bias voltage that operates in conjunction with the parasitic capacitance of the push-pull transistors to speed up their operation and thus create faster edge transitions.

Another area where changes were made to accommodate the doubling of the speed of the present invention camera over that of the previous design is A/D converters 22 and 23 of FIG. 1. In the previous design, CCD imager array 12 provides two output channels of multiplexed data, each at 32 Mpixel/sec., whereas in the camera of the present invention that same CCD imager array produces the same two channels of multiplexed data at 64 Mpixel/sec. each. One of those channels provides RGRG multiplexed data and the other GBGB multiplexed data as indicated in FIG. 1 at the output of amplifiers 18 and the inputs to amplifiers 20 and 21.

Thus, in the present invention the two data channels from CCD imager array 12 have a combined bandwidth of 128 Mpixel/sec. At the time of the present invention there were low cost A/D flash converters with 10 bits having a maximum bandwidth of 48 Msamples/sec. Thus, to accommodate the bandwidth of the high speed camera of the present invention with the same type of A/D converters it is necessary to use two A/D converters of that type for each channel of multiplexed data from CCD array 12.

Figure 3:
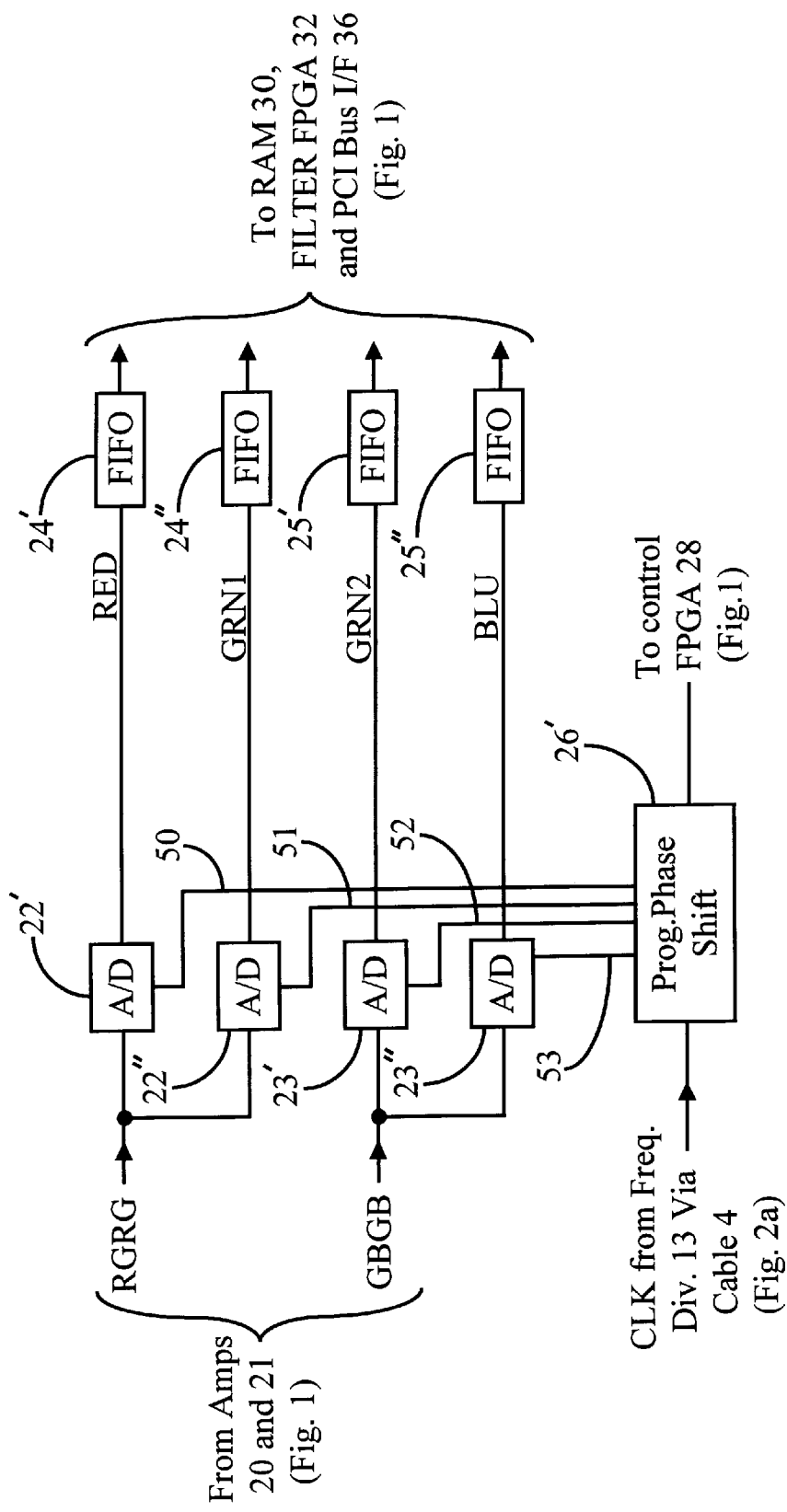
FIG. 3 is a block diagram representation of the analog to digital conversion and data signal demultiplexer configuration of the present invention.

FIG. 3 illustrates the A/D configuration of the present invention to handle the 128 Mpixel/sec. bandwidth from CCD array 12. Thus, A/Ds 22 and 23 and FIFOs 24 and 25 of FIG. 1 are replaced with the configuration shown in FIG. 3. So A/D 22 (FIG. 1) is replaced with A/Ds 22' and 22" with both receiving the GRGR input signal from amplifier 20, and A/D 23 (FIG. 1) is replaced with A/Ds 23' and 23" with both receiving the GBGB input signal from amplifier 21. Then, essentially, each of A/Ds 22' and 23' are clocked with the 32 MHz CLK signal from frequency divider 13 (see FIG. 2a) via cable 4 and programable phase shifter 26', and A/Ds 22" and 23" are clocked with CLK-not, the inverse of the clock signal, to the companion A/D in each case. Thus by using both the rising and falling edges of the CLK signal, the effective sampling rate of the A/D function is 128 Mpixels/sec. with a 32 MHz clock signal in control subsystem 6.

The A/D clocking scheme described in the previous paragraph is somewhat of an oversimplification of what is actually needed. While the four clock signals to A/Ds 22', 22", 23' and 23" are substantially as described above, in fact, each of the four clock signals needs to be individually adjusted in the initial setup procedure as described above with the programable phase shifter 26 providing four separate clock signals. In other words the CLK signal needed by each of A/Ds 22' and 23' may be slightly out of phase with each other, as might the CLK-not signals used with A/Ds 22" and 23". Additionally, each CLK-not signal for A/DS 22" and 23" may not be exactly 180° out of phase with the corresponding CLK signal needed for A/D 22' and 23', respectively. Thus, all four cf the clock signals must be independently adjustable during set-up. Therefore, with this approach it is possible to get a 128 Mpixel/sec. rate with slower, low cost parts.

As discussed above for the prior art camera, the setting of the clocking phase shifts for A/Ds 22', 22", 23' and 23" are a one time set-up per actual cable 4 that is being used. These variations of clock phase shift result from variations in line length, orientation of lines with respect to others lines in the cable and varying printed circuit (PC) trace lengths, as well as the fact that the video signals are carried through coaxial cables within cable 4 while other signals (e.g., CLK) are carried by twisted pairs so the propagation times are different.

The A/D configuration of FIG. 3 also automatically demultiplexes the two multiplexed input signals received from CCD array 12. Thus, A/Ds 22' and 22" each receive the RGRG signal with red as the digitized output of A/D 22' and with green1 (GRN1) as the digitized output of A/D 22". Similarly, A/Ds 23' and 23" each receive the GBGB signal with green 2 (GRN2) as the digitized output of A/D 23' and with blue (BLU) as the digitized output of A/D 23". Note that since green has twice as many pixels in the input signals (i.e., green is a component of both multiplexed signals) than does either red or blue, there are two channels of green (GRN1 and GRN2) output signals from the A/Ds. So this configuration of A/Ds demultiplexes the input signals, as well as provides the necessary bandwidth with lower cost, lower bandwidth components. In the camera of the previous design the demultiplexing was performed as one of the functions of filter FPGA 32 (FIG. 1).

Thus, the signals from A/Ds 22', 22", 23' and 23" are each at a 32 Mpixel/sec. rate thus allowing the downstream components to operate at the 32 MHz rate as in the camera system of the previous design.

The present design handles information at twice the pixel rate of the camera of the previous design while still using the same clock rate in control subsystem 6 which permits the use of components that have a maximum upper clock rate of slightly higher than 32 MHz. In the present design the demultiplexed signals coming from each the A/Ds are at half the actual channel pixel rate with filter FPGA 32 being provided data at substantially the same rate as in the camera of the previous design discussed above.

Figure 4:
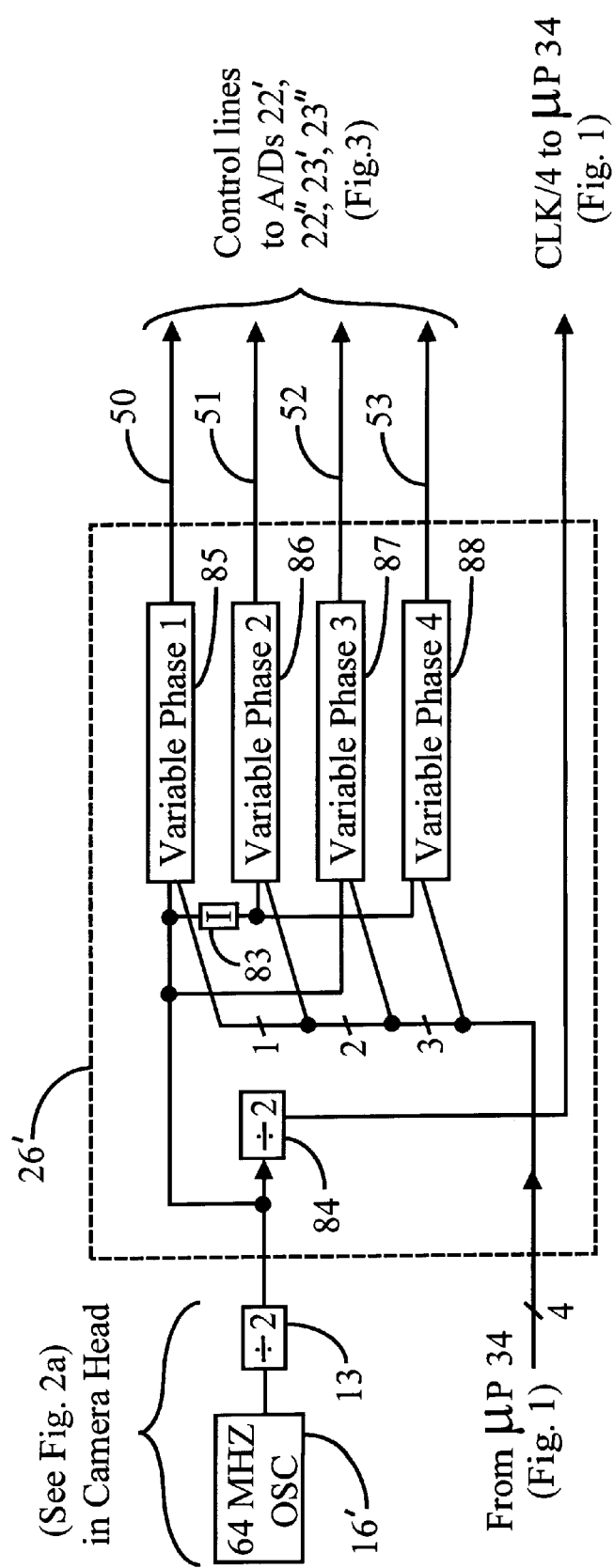
FIG. 4 is a block diagram of the programable phase shifter of the present invention.

Next, in FIG. 4 there is shown a block diagram of programable phase shifter 26' of the present invention. In the camera system of the previous design of FIG. 1 there are two A/Ds 22 and 23 with programable phase shifter 26 providing two independently adjustable 32 MHz clock signals that are each individually adjustable and substantially in phase with each other. In the present invention, as discussed above, there are four 32 MHz clock signals required by A/Ds 22', 22", 23' and 23", the phase of each being independently adjustable. Thus, programable phase shifter 26' receives a 32 MHz clock signal from frequency divider 13 in camera head 2 via cable 4. The 32 MHz clock signal from frequency divider 13 is then applied to frequency divider 84 and to each of the four identical and independently variable phase shifter circuits 85–88 with the 32 MHz clock signal first passing through inverter 83 for variable phase shift circuits 86 and 88. Inverter 83 has been included since A/D converters 22" and 23" (which are driven by phase shift circuits 86 and 88) are triggered on the falling edge of the clock. The output from frequency divider 84 provides the 16 MHz clock signal needed by microprocessor 34. Each of variable phase shifter circuits 85–88 also receive an input signal from microprocessor 34 that is proportional to the amount of phase shift determined to be necessary during the initial calibration of the system with the selected cable, as discussed above. Then on output lines 50–53 of each of variable phase shifter circuits 85–88, the individual phase adjusted clock signals for each of A/Ds 22', 22", 23' and 23" of FIG. 3 are presented.

Figure 5:
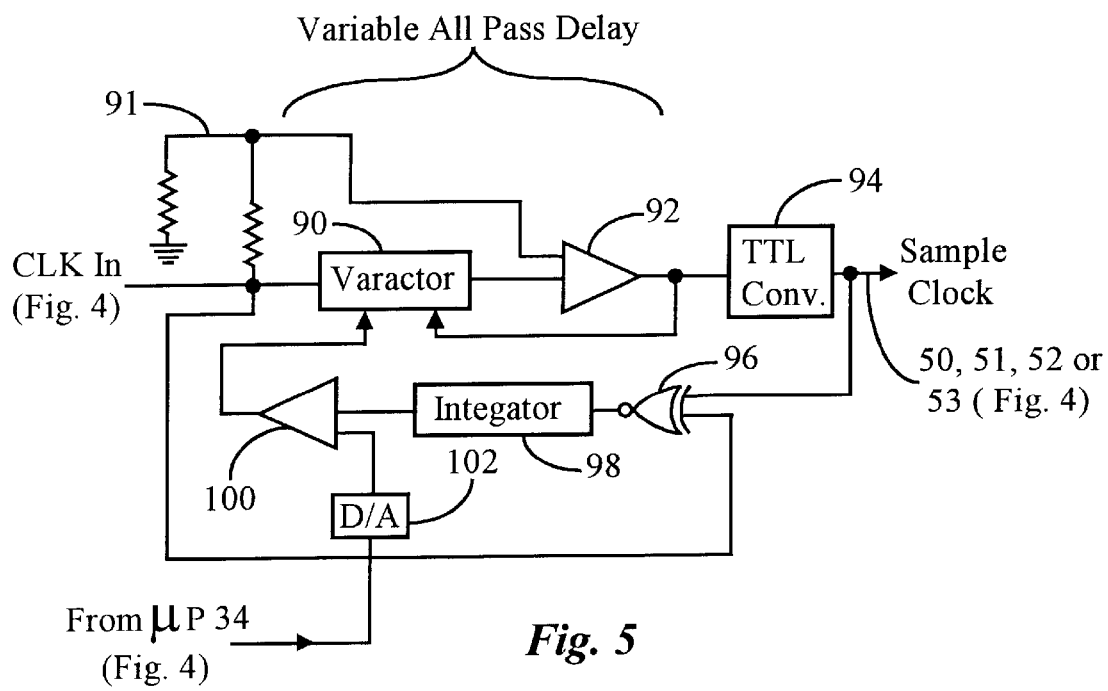
FIG. 5 is a detailed block diagram of an individual variable clock phase shifter circuit of the present invention which is a component part of the phase shifter as in FIG. 4.

FIG. 5 is a block diagram for one of the four variable phase shifter circuits 85–88 with the other three having the same configuration. A new circuit from that of the previous design for each of the individual phase shifters here is necessary due to the increased bandwidth of the signal of the present invention and the need for more temperature stability as a result to support the doubling of the data rate from that of the previous design.

Figure 6:
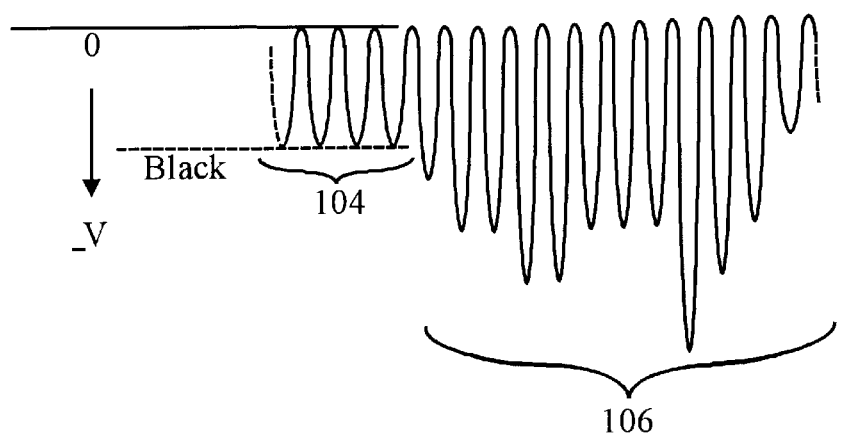

The two output signals from CCD array 12 (RGRG and GBGB) are very high frequency (64 MHz) analog signals with video energy concentrated at narrow peaks in each video signal as shown in FIG. 6. These signal peaks are separated by large reset clock signals at 64 MHz which propagate the image charges through the output shift register of the CCD array. To capture the video information in those signals, A/Ds 22', 22", 23' and 23" must repeatedly sample the corresponding video signal (RGRG or GBGB) at each exact peak of that signal, which at 64 MHz is a very narrow window. This requires a high precision clock signal, for each of the A/Ds, whose phase relative to the incoming video signal does not drift with temperature, or otherwise. In the application of the present invention a drift of more than 1 nsec. out of 30 nsec. is unacceptable. A maximum drift of ±0.25 nsec. is the goal in this high speed video application.

As will be seen in the discussion below, the phase delay circuit of the present invention is a closed loop and can provide a maximum of ±90° of phase shift. The circuit that is used here is unique in that it holds the output clock signals (sample clock in FIG. 4) at a precise phase delay from an incoming clock (CLK IN FIG. 4) under control of an input voltage.

As shown in FIG. 5, the variable phase shifter circuit (each of phase shifter circuits 85–88 in FIG. 4) of the present invention is a closed loop, high frequency, all pass phase delay circuit; four of these circuits are used in programable phase shifter 26' (see FIGS. 3 and 4) to permit individual adjustment of the clock phase before applying the sample clock signal to the corresponding A/D 22', 22", 23' or 23". In the upper left of FIG. 5 a clock signal (CLK IN) is received from cable 4 and applied to varactor 90 and voltage divider 91 with an attenuated clock signal applied to the positive terminal of operational amplifier 92 from voltage divider 91. The output signal from varactor 90 is then applied to the negative terminal of operational amplifier 92. The output of operational amplifier 92 is then fed back to varactor 90 and applied to a TTL converter 94 to produce the sample clock signal with TTL logic voltage levels that is then applied to the corresponding A/D converter (see FIG. 3) and to control FPGA 28 (see FIG. 1).

In the feed-back path, exclusive NOR gate 96 (e.g., 74AC86) receives the phase shifted sample clock signal at one input terminal and the CLK IN signal applied at the second input terminal. The two clock signals, CLK IN and sample clock, are compared by exclusive ORing them to produce a signal that is proportional to the phase difference between the two clock signals, as well as the polarity of that difference. The resulting signal from gate 96 is then applied to integrator 98 to create an analog signal that is proportional to the phase difference between the two clock signals. This technique has been employed since this circuit has low temperature sensitivity. The average voltage from integrator 98 will thus remain stable regardless of circuit drift, signal speeds, part values, as well as temperature variations.

Next in the feed-back path is operational amplifier 100 which receives one input from integrator 98 and a second input from D/A 102 to scale the signal magnitude to be applied to varactors 90 to produce the desired phase delay. Since the signals being applied to operational amplifier 100 are low frequency signals, it is not necessary that amplifier 100 be a high frequency amplifier. The output signal from operational amplifier 100 is a DC level that is applied to varactor 90 to adjust the phase delay of the CLK IN signal as it passes therethrough. D/A 102 receives a fixed input signal from microprocessor 34, with that signal representing the phase delay having been selected during the initial set-up of the camera to match cable 4 with control subsystem 6 to capture the video signal being processed by the corresponding A/D converter of FIG. 3.

In summary, the delay (i.e., phase shift) of the output sample clock is measured and compared against the CLK IN with the error voltage (created as a duty cycle difference by the XOR gate and averaged by a low pass filter) being applied to varactors to change the delay that is being generated. This feedback configuration eliminates the effect of temperature changes on the circuit, producing a very accurate clock position that is programmable in fine digital steps via D/A 102 under control of microprocessor 34 (FIG. 1). While in the above discussion varactors are used in the voltage controllable phase delay feedforward path, there are other techniques that can be employed to accomplish the same result.

In FIG. 6 there is shown a typical video signal that is generated by each of the two channels of CCD array 12 and is delivered to each of A/Ds 22', 22", 23' and 23". Since CCD array 12 is running at 64 MHz, the frequency of the signal variations in the video signal occur at that frequency with the video information being the height of the peaks of that signal. Thus, when the video signal is sampled by the corresponding A/D 22', 22", 23' and 23", it is the peaks that are being sampled. Thus, the need to align the clock pulses with peaks of the video signal that is applied to the corresponding A/D as was discussed above with respect to FIGS. 3, 4 and 5 in the initial setup for the system with a particular cable 4.

A typical video signal is a negative going signal with each line of video information beginning with a fixed number of 'lack' pulses that have an amplitude in a black region 104 generated by CCD array 12 without being exposed to external light, followed by a long series of 'active' pulses in an active region 106. Thus, when the video signal is sampled with A/Ds 22', 22", 23' and 23" (see FIG. 3) the peaks of the video signal are being sampled as a result of the phase adjustment of the individual clock signals to the A/D with the pixels from the various A/Ds being either black pixels or active pixels corresponding to whether the information into the A/D was from the black region 104 or the active region 106 of the video signal.

To obtain a true measure of the amplitude of the active pixels from the A/Ds, the black level, or the average amplitude of the pulses in black region 104 must be determined. This is done to permit the shifting of the active pixel levels to eliminate the black level and thus generate a zero reference level that corresponds to the black level.

Typically what is done in many camera systems is to filter the video signal to remove the clock information from the video signal. However, at the frequencies at which the camera system of the present invention is operating filtering the clock from the video signal does not work very well since the magnitude of the desired signal having the actual video information is much smaller than the magnitude of the clock signal. Thus, by aligning the clock signal phase with the video signal received by each of the A/Ds, the low amplitude video information is sampled from the clock signal and then digitized creating the video pixels of interest. That sampling results in the removal of the clock noise in the raw video signal applied to the A/Ds.

Once the clock noise has been removed and the video data pixelized, the operation of the camera is further improved by determining the level of the black pixels to permit shifting of the level of the raw video signals to substantially zero out the black level so that a "0" level pixel represents black.

The black level is typically removed in prior art cameras by clamping the black region to electrical ground to align the video signal before the video signal is applied to A/Ds to digitize the video information. As will be seen in the following discussion, in the present invention the raw video signal, without first adjusting for the black level, is digitized, then the video pixels are examined to determine the black level, and then the black level information is feed back to the camera head where the output level of the output amplifiers is shifted to compensate for the black level in the video signal from the CCD array. Using this approach, the black level is subtracted from the video signal with a DC offset signal to the amplifiers so that the signal presented to the A/D converters is in the right digitizing range.

There are several approaches that can be used to determine the black level of the incoming video signal. However, given the high frequency of the analog signal, that can not easily be done in the analog domain. The simplest approach is to use the level of the first black signal in each line of data. At the high frequency at which the present camera is operating there is a considerable amount of noise thus relying on a single black pixel is not very reliable. To minimize the effect of that noise in the present invention, all of the leading black pixels in each line are averaged together to determine the offset level that is to be fed back to amplifiers 18 in camera head 2.

A typical CCD array 12 has two processing channels, one to generate a RGRG signal and a second to generate a GBGB signal. Each of those channels includes up to approximately 26 sampling locations that are masked off so that light does not reach them. Thus those first samples in each line of video data on each channel represents the black level from the CCD array.

Figure 7:
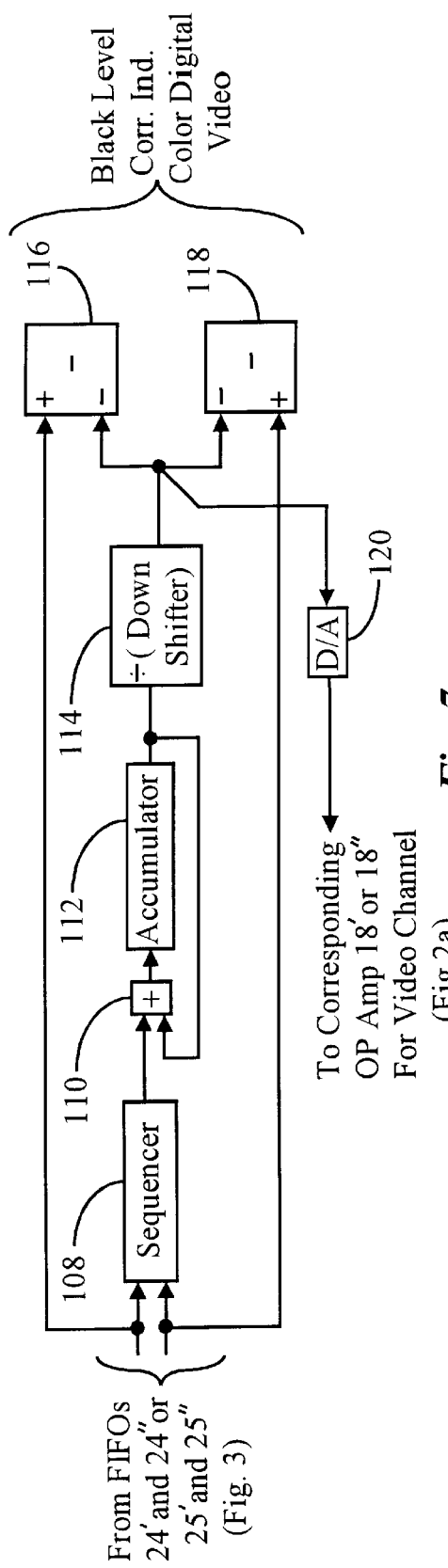
FIG. 7 is a block diagram of the video black level determination technique of the present invention.

FIG. 7 is a block diagram that illustrates the generation of a black level corrected digital video signal in the present invention for a single video channel with that operation being implemented as a part of filter FPGA 32. Since there are two video channels being provided by CCD array 12, this operation will have to be performed twice, once for each video channel since the black level for each channel is independent of the other channel. In FIG. 3 each of the two video channels were demultiplexed into individual color pixel streams as discussed above. Thus the first several pixels in each line in each color data pixel stream will represent black, or dark reference, pixels. Therefore, to determine the black level of the signal from each channel of the CCD array, a preselected number of the black pixels in the corresponding color data stream for each line must be obtained from the corresponding color data streams. For example, if 16 dark reference pixels are to be used to determine the black level of a channel of the CCD array, then eight of the dark reference pixels from each corresponding color data stream are received from the corresponding FIFOs (either 24'–24" or 25'–25") and applied to sequencer 108 in FIG. 7 to reconstruct a partial serial video signal stream for the corresponding video channel (i.e., 16 bits long in the present example). That sequenced serial stream of digital black pixels for the corresponding channel are then applied to one input of adder 110, and then the individual pixel values from adder 110 are applied to accumulator 112 where the first pixel is added to zero and fedback to the second input of adder 110 to be added to the pixel value of the second black pixel which is then transferred to accumulator 112. Accumulator 112 then feeds back the accumulated total of the values of the first two black pixels to the second input of adder 110 to be added to the value of the third black pixel with the resultant total of the three black pixels then passed to accumulator 112. This procedure is thus continued until accumulator 112 has an accumulated value for all 16 individual black level values in this example. A digital signal of the final accumulated value of the 16 black pixels at the beginning of the line of video data is then applied to divider 114 where the accumulated value is divided by 16 (or the appropriate value if other than 16 black samples are used) to determine the average black pixel value. Note that given that the signal from accumulator 114 is digital and that the accumulated result in this example is to be divided by 16 ($2^4$), divider 114 can be implemented by shifting the accumulated result by four bits. The average black pixel value for the current line of video data is then applied to the minus terminal of first and second color subtractors 116 and 118 with the raw video data from the corresponding FIFOs applied to the plus terminal of each of subtractors 116 and 118 to create a black level corrected individual color digital video data stream.

The black level could be determined with any number of dark reference pixels that are available from the CCD array, from one to the maximum number available. However, the more black reference pixel values that are used to determine the black level for the active pixels, the less black level noise will be present.

To adjust the analog video signal from amplifiers 18' and 18" in FIG. 2a for the black level offset presented by CCD array 12, the digital black level pixel value from divider 114 is applied to D/A converter 120 with the resultant analog value being applied to the corresponding one of operational amplifiers 18' and 18" in FIG. 2a for the video channel being compensated. By providing this feedback to amplifiers 18' and 18" the limits of the amplifiers are less likely to be exceeded, and the raw analog video signal being provided to A/Ds 22', 22", 23' and 23" remains centered in the range of the A/D converters thus maximizing the dynamic range and allowing better tracking of the video signals by the A/D converters.

Figure 8:
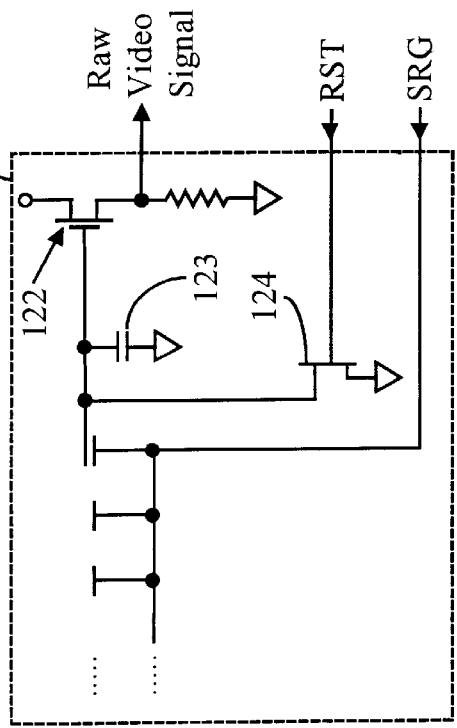
FIG. 8 is a schematic representation of a typical output stage of a CCD array.

Interpixel smearing of the video signal is also a problem when CCD array 12 is operated to at a rate that is faster than the output stage was designed to support. Referring to FIG. 8 there is shown a simplified output stage of CCD array 12. Within a CCD array the video data consists of a charge packet that is shifted through the array with the various clock signals discussed above. It might be visualized as a 'bucket brigade' as the charge ripples through the CCD array. To convert that charge to a voltage level that is proportional to the corresponding charge, the final stage of the CCD array applies the accumulated charge to a capacitor 123 that is connected between the gate terminal of FET 122 and signal ground, with the raw video signal provided to the following circuitry on the source or drain of FET 122. If the charge from the CCD array were continually transferred to capacitor 123, capacitor 123 would continue to acquire more and more charge. Thus, a second FET 124 is connected across capacitor 123 to discharge capacitor 123 to ground at the pixel rate resulting in a raw video signal as shown in FIG. 6 with the video data superimposed on a very strong clock signal.

The typical CCD array was designed to run at a clock frequency of approximately 7 MHz, thus as the clock frequency is increased as in the present invention, there is a smearing of some of the charge from a previous pixel into one or more following pixels. This results from the fact that FET 124 has a finite impedance between the drain and source when activated. Therefore there is a time constant that results from the internal impedance of FET 124 and capacitor 123. In the present invention, CCD array 12 is being clocked faster than that time constant which results in incomplete discharging of capacitor 123 each time FET 124 is turned on. So a particular charge packet that was put on capacitor 123 is mostly discharged in a closure of FET 124, but there is a little of the charge left on capacitor 123 that is combined with the charge of the next video sample. Then in the next sample there is a lesser amount of the charge from the two previous samples, and so on, so there is a tapering-off effect of a sample where the information is smeared into the next pixel sample, or several following samples. Thus, an interference filter is needed to minimize the smearing effect of the high speed at which the CCD array is being operated. If the smearing effect is not compensated, the output image presented to the user will not appear sharp and will have color space errors.

To counteract the smearing, a digital signal processing solution is implemented in filter FPGA 32 (see FIG. 1). Thus, the present invention makes this correction after the video signals have been digitized. Stated in general terms, the current pixel value is multiplied by a fractional constant of less than one, and then that value is subtracted from the pixel value of the next pixel in time in the same channel (i.e., RGRG or GBGB). If the smearing of a pixel is sufficiently great, then a second smaller fractional value of the current pixel value is also subtracted from the second following pixel in time in the same channel.

Note that in FIGS. 1 and 3 there are two video channels of data that were received from CCD array 12, namely RGRG and GBGB. In the FIG. 1 camera system the data rate from CCD array 12 is 64 Mpixel/sec. which is processed with one A/D converter for each channel (i.e., A/D 22 for the RGRG channel and A/D 23 for the GBGB channel). FIG. 3 illustrates the A/D conversion operation for the 128 Mpixel/sec. embodiment. As a result of the A/D operation of FIG. 3, as discussed above, each of the RGRG and GBGB channels of video data have been converted to two data streams, yielding RED, GRN1, GRN2 and BLU. However, if the current pixel is a RED pixel from FIFO 24', the next pixel in time in the same channel is a GRN1 pixel from FIFO 24". In turn the second following pixel in time is the next RED pixel, the third pixel in time is the next GRN1 pixel, etc. Similarly, if the current pixel is GRN2 from FIFO 25', the next pixel in time in the same channel is a BLU pixel from FIFO 25". In turn the second following pixel in that channel is the next GRN2 pixel, the third in time is the next BLU pixel, etc.

First the 64 Mpixel/sec. embodiments for anti-smearing will be addressed with FIGS. 9a and 9b illustrating the one and two pixel anti-smearing techniques described in general above using the data streams from FIFOs 24 and 25 of FIG. 1 where the two A/D converter configuration is shown, and with FIGS. 9c and 9d illustrating one and two pixel anti-smearing techniques discussed above using the data streams from FIFOs 24', 24" (RGRG channel), 25' and 25" (GBGB channel) of FIG. 3 where the four A/D converter configuration is shown. For each of these discussions parallel arithmetic is assumed. However, other techniques that perform the same function could be implemented. Note that all of the functions of the smearing correction described in relation to FIGS. 9a–9d are described as performing the arithmetic functions on bytes of data (i.e., the number of bits in a single pixel, e.g., 8 bits) with the resultant byte having the same number of bits as each other pixel byte at each point in the intermediate and final results.

FIG. 9a adds two single pixel anti-smearing paths, one for the RGRG signal stream and one for the GBGB signal stream from FIFOs 24 and 25, to the implementation of FIG. 1. In the top portion of FIG. 9a the RGRG data signal stream is applied to the positive terminal of subtractor 154 and to a one pixel delay 150. The previous pixel (N–1) from delay 150 is then applied to a multiplier 152 where the pixel value is multiplied by a selected fraction value, x (e.g., 0.2). The output of multiplier 152 is then applied to the negative terminal of subtractor 154 where the fractional value of the previous pixel is subtracted from the current value of the present pixel with the data stream from subtractor 154 being the single pixel compensated video signal for the RGRG channel. Similarly, the GBGB data signal stream is applied to the positive terminal of subtractor 154' and single pixel delay 150', the previous pixel value multiplied by a selected factor, x, by multiplier 152" (the value of this x factor may be slightly different from the x factor of multiplier 152), the reduced value previous pixel is then applied to the negative terminal of subtractor 154' where it is subtracted from the current pixel value for the GBGB data stream yielding from subtractor 154' a single pixel compensated video signal for the GBGB data stream.

In FIG. 9b the technique of compensating the video data stream for smearing from two previous pixels is illustrated for a two A/D implementation of a camera as in embodiment of FIG. 1. Here, as in FIG. 9a, two data streams are applied to the positive terminal of subtractor 154 and 154', respectively, and to a two byte delay 150" and 150'", respectively. As was the case in FIG. 9a, the most previous pixel byte (N–1) in each data stream from the delay is multiplied by a factor, x (which might be slightly different from each other), by multipliers 152 and 152', respectively, while the second previous pixel byte (N–2) from the delay is multiplied by a factor, y (which also might be slightly different from each other), by multipliers 156 and 156', respectively. Additionally, the factor "y" is less than the factor "x" (e.g., "y" might be approximately 0.1).

FIG. 9c is a block diagram that illustrates a one pixel anti-smearing technique described in general above using the data stream from FIG. 3 where the four A/D converter configuration is discussed. Since there are two video data streams (RGRG and GBGB) that have been demultiplexed by the circuit of FIG. 3, there will be two similar anti-smearing corrections that need to be performed with a duplication of the function of FIG. 9c for each video data channel. To indicate that FIG. 9c is applicable to each video data channel, the input signals from the FIFOs of FIG. 3 have been shown in the alternative for each of the two input lines in FIG. 9c, namely either RED and GRN1 for the RGRG channel data from A/Ds 22' and 22", or GRN2 and BLU for the GBGB channel data from A/Ds 23' and 23". Note, that since there are two data streams, the operation described as follows must be performed twice, once for the RGRG channel, and once for the GBGB channel. Thus, the RED and GRN1 or the GRN2 and BLU pixel data streams are applied to the positive terminal of first and second subtractors 130 and 132, respectively, and to first and second delay lines 126 and 128, respectively, with each delay line being one pixel byte long (e.g., 8 bits). Then the $(N-1)^{st}$ GRN1 (BLU) pixel from second delay line 128 is applied to first multiplier 134 where it is multiplied by a preselected, less than unity, fractional value factor x, with the resultant reduced value of the $(N-1)^{st}$ GRN1 (BLU) pixel applied to the negative terminal of first subtractor 130. The smearing compensated RED (GRN2) pixel is the result of that subtraction.

Similarly, the $(N-1)^{st}$ RED (GRN2) pixel from first delay line 126 is applied to second multiplier 136 where it is multiplied by the same preselected, less than unity, fractional value factor x (perhaps 0.25), with the resultant reduced value of the $(N-1)^{st}$ RED (GRN2) pixel applied to the negative terminal of second subtractor 132. The smearing compensated GRN1 (BLU) pixel is the result of that subtraction. By performing the anti-smearing function in this way without recombining the pixels of a channel, the 128 Mpixel data rate of the present invention can still be processed as if it were a 64 Mpixel rate as discussed above, thus further enabling the use of less expensive, slower digital components.

FIG. 9*d* illustrates smearing correction over the previous two pixels in the data stream using an extension of the technique described above in relation to FIG. 9*a*. The differences here to that of FIG. 9*c* is first that the delay lines 126' and 128' are now two pixels long (e.g., 16 bits) to hold the two previous pixel bytes in each of the demultiplexed data streams. The first pixel subtraction components of FIG. 9*a* are shown here with the same reference numbers and they operate in the same manner as described in FIG. 9*c*.

To subtract a factor of the value of the second previous pixel in the channel, the pixel of the same color as the pixel being corrected is used since in the actual data channel the colors alternate (i.e., RGRG or GBGB). Thus, to correct for the smearing from the second previous pixel in the data stream, the one pixel corrected value from first subtractor 130 is applied to the positive terminal of third subtractor 138. The pixel value of the (N-2) RED (GRN2) pixel from delay line 126' is then applied to third multiplier 142 where the value is multiplied by a preselected, less than unity, factor y (where y is smaller than x and perhaps has a value of 0.1), and the resultant multiplied value from third multiplier 142 is applied to the negative terminal of third subtractor 138. The two pixel, smear corrected current RED (GRN2) pixel is then provided by third subtractor 138.

Similarly, the GRN1 (BLU) pixel is corrected using delay line 128', fourth multiplier 144 (using the same multiplication factor y as in third multiplier 142), and fourth subtractor 140 to provide the two pixel smear corrected current GRN1 (BLU) pixel from fourth subtractor 140.

In the present invention, the anti-smearing function is performed in firmware as one of the functions of filter FPGA 32. Thus, it can be seen that the technique of the present invention can easily be extended to correct for smearing from any number of previous pixels in the data stream that may be desired. Additionally, the above discussion, for simplicity, indicated that the fractional factors were the same (i.e., x=x and y=y) it may be necessary to make those factors slightly different for each other given the speed at which the circuits are operating the inherent tolerances of the various components.

In the various preceding discussions with respect to each of the improvements of the present invention the discussion has generally been for a camera in the color mode. The various techniques and circuit implementations discussed above are also applicable to black and white. The only difference in each of the discussions where the various component colors were discussed is that in the black and white mode each pixel will be a gray scale pixel and they will be operated on in exactly the same way as described for the component color pixels.

The preceding discussion has been provided to illustrate the techniques of the present invention and at least one possible implementation of each of those techniques which individually and collectively contribute to the high speed, increased bandwidth camera design of the present invention. Given the ideas presented here, one skilled in the art would be able to derive alternative embodiments to accomplish similar results. Clearly those alternative embodiments are included within the scope of the ideas presented here either directly or as equivalents that one skilled in the art will recognize as such.

What is claimed is:

1. A high speed electronic camera comprising:
    a control subsystem to generate internal control signal;
    an oscillator of a selected frequency to define a maximum signal frequency of the camera;
    a lens assembly disposed to receive an image;
    a two channel CCD array having an active image receiving area and a plurality of interactive terminals with said active image receiving area disposed to receive said image from said lens assembly and to provide an image data signal from each of said two channels for each line of said image;
    a plurality of vertical and horizontal image drivers coupled to corresponding ones of said interactive terminals of said two channel CCD array, said oscillator and said control subsystem to advance image charges through and from each channel of said CCD array under control of said oscillator utilizing signals received from said control subsystem;
    a frequency divider coupled to said oscillator to provide a clock signal at one-half said selected frequency of said oscillator with each clock pulse from said frequency divider having a rising edge and a falling edge;
    a first A/D converter and a second A/D converter connected to said CCD array for each to receive one of said image data signals;
    a third A/D converter and a fourth A/D converter connected to said CCD array for each to receive the other of said image data signals;
    wherein said first and third A/D converters are coupled to said frequency divider to advance the corresponding data signal through the A/D converter using the rising edge of each clock pulse from said frequency divider, and said second and fourth A/D converters are coupled to said frequency divider to advance the corresponding data signal through the A/D converter using the falling edge of each clock pulse from said frequency divider; and
    an output interface coupled to each of said first, second, third and fourth A/D converter to present said pixel bit streams that are representative of said image to a user.

2. A high speed electronic camera as in claim 1 wherein said first, second, third and fourth A/D converters collectively automatically demultiplex the two image data signals from said CCD array.

3. A high speed electronic camera as in claim 2 wherein:
    one channel of said CCD array provides a RGRG data signal and the other channel of said CCD array provides a GBGB data signal;
    said first and second A/D converters each receive said RGRG data signal, and said third and fourth A/D converters each receive said GBGB data signal; and said first A/D converter provides a RED pixel data signal, said second A/D converter provides a GRN1 pixel data signal, said third A/D converter provides a GRN2 pixel data signal, and said fourth A/D converter provides a BLU pixel data signal.

4. A high speed electronic camera as in claim 1 further comprising:
- a first variable phase shift circuit coupled between said frequency divider and said first A/D converter to selectively shift the phase of said clock signal from said frequency divider prior to application to said first A/D converter to clock the signal through said first A/D converter;
- an inverter coupled to said frequency divider to invert tie clock signal therefrom;
- a second variable phase shift circuit coupled between said inverter and said second A/D converter to selectively shift the phase of said inverted clock signal from said inverter prior to application to said second A/D converter to clock the signal through said second A/D converter;
- a third variable phase shift circuit coupled between said frequency divider and said third A/D converter to selectively shift the phase of said clock signal from said frequency divider prior to application to said third A/D converter to clock the signal through said third A/D converter; and
- a fourth variable phase shift circuit coupled between said inverter and said fourth A/D converter to selectively shift the phase of said inverted clock signal from said inverter prior to application to said fourth A/D converter to clock the signal through said fourth A/D converter;
- wherein the phase shift of each of said first, second, third and fourth variable phase shift circuits is selected upon calibration of the camera to compensate for internal delays within the camera with those phase shifts being stored in said control subsystem.

5. A high speed electronic camera as in claim 4 wherein each of said first, second, third and fourth of variable phase shift circuits is temperature compensated and includes:
- a feedforward path having:
  - a voltage controlled delay circuit coupled to receive said clock signal and to selectively delay said clock signal; and
  - a TTL level translator coupled to said voltage controlled delay circuit to convert said delayed clock signal to a TTL sample clock signal selectively delayed from said clock signal with said sample clock signal being disposed to be applied to a corresponding one of said first, second, third and fourth A/D converters as the clock signal; and
- a feedback path having:
  - an exclusive NOR gate having one input terminal coupled to receive said sample clock from said differential to TTL level translator and a second input terminal coupled to the input of said voltage controlled delay circuit to produce a signal that is proportional to the phase difference between said clock and sample clock signals together with the polarity of that difference;
  - an integrator coupled to said exclusive NOR gate to receive said difference signal to convert that difference signal to an analog signal that is proportional to a difference represented by said difference signal;
  - a D/A converter coupled to said control subsystem to receive a signal corresponding to said stored phase shift that corresponds to the corresponding variable phase shift circuit and to convert that phase shift signal to an analog signal; and
  - an operational amplifier having a first input terminal coupled to receive said analog difference signal from said integrator and a second input terminal to receive said analog phase shift signal from said D/A converter with said output terminal coupled to said voltage controlled delay circuit to scale a voltage feedback signal to adjust the phase delay of said variable phase shift circuit.

6. A high speed electronic camera as in claim 1 further including a pair of anti-smearing assemblies wherein each anti-smearing assembly has:
- a first delay line coupled to said first or third A/D converter to hold the next previous byte of pixel data from said first or third A/D converter;
- a second delay line coupled to said second or fourth A/D converter to hold the next previous byte of pixel data from said second or fourth A/D converter;
- a first multiplier coupled to said second delay line to receive said next previous byte of pixel data to multiply a value of said next previous byte of pixel data from said second or fourth A/D converter by a first preselected fractional value to obtain a first reduced value pixel byte;
- a second multiplier coupled to said first delay line to receive said next previous byte of pixel data to multiply a value of said next previous byte of pixel data from said second or fourth A/D converter by a second preselected fractional value to obtain a second reduced value pixel byte;
- a first subtractor coupled to receive said latest byte of pixel data from said first or third A/D converter and coupled to said first multiplier to receive said first reduced value pixel byte to subtract the value of said first reduced value pixel byte from the value of said latest byte of pixel data from said first or third A/D converter to generate a first corrected pixel byte; and
- a second subtractor coupled to receive said latest byte of pixel data from said second or fourth A/D converter and coupled to said second multiplier to receive said second reduced value pixel byte to subtract the value of said second reduced value pixel byte from the value of said latest byte of pixel data from said second or fourth A/D converter to generate a second corrected pixel byte.

7. A high speed electronic camera as in claim 6 wherein said first and second preselected fractional values are substantially the same.

8. A high speed electronic camera as in claim 6 wherein:
- said first delay line also holds a second next previous byte of pixel data from said first or third A/D converter;
- said second delay line also holds a second next previous byte of pixel data from said second or fourth A/D converter;
- said first subtractor generates a first corrected pixel byte;
- said second subtractor generates a second corrected pixel byte; and
- each anti-smearing assembly further includes:
  - a third multiplier coupled to said first delay line to receive said second next previous byte of pixel data to multiply a value of said second next previous byte of pixel data from said first or third A/D converter by a third preselected fractional value to obtain a third reduced value pixel byte;

a fourth multiplier coupled to said second delay line to receive said second next previous byte of pixel data to multiply a value of said second next previous byte of pixel data from said second or fourth A/D converter by a fourth preselected fractional value to obtain a fourth reduced value pixel byte;

a third subtractor coupled to said first subtractor to receive said first corrected pixel byte and coupled to said third multiplier to receive said third reduced value pixel byte to subtract the value of said third reduced value pixel byte from the value of said first corrected pixel byte to generate a third corrected pixel byte; and a fourth subtractor coupled to said second subtractor to receive said second corrected pixel byte and coupled to said fourth multiplier to receive said fourth reduced value pixel byte to subtract: the value of said fourth reduced value pixel byte from the value of said second corrected pixel byte to generate a fourth corrected pixel byte.

9. A high speed electronic camera as in claim 8 wherein:

said first and second preselected fraction values are substantially the same as each other;

said third and fourth preselected fractional values are substantially the same as each other; and said first and second preselected fractional values are each greater than each of said third and fourth preselected fractional values.

10. A high speed electronic camera comprising:

a control subsystem to generate internal control signals;

an oscillator of a selected frequency to define a maximum signal frequency of the camera and provide a clock signal;

a lens assembly disposed to receive an image;

a multi-channel CCD array having an active image receiving area and a plurality of interactive terminals with said active image receiving area disposed to receive said image from said lens assembly and to provide a data signal from each of said channels, respectively;

a plurality of vertical and horizontal image drivers coupled to corresponding ones of said interactive terminals of said multi-channel CCD array, said oscillator and said control subsystem to advance image charges through and from each channel of said CCD array under control of said oscillator utilizing signals received from said control subsystem;

a plurality of A/D converters connected to said CCD array to each receive said data signals from said CCD array and to create data pixel bit streams;

a plurality of variable phase shift circuits each coupled between said oscillator and a different one of said plurality of A/D converters to selectively shift the phase of said dock signal from said oscillator prior to application to a corresponding one of said A/D converters to clock the signal through said corresponding A/D converter, wherein the phase shift of each of said variable phase shift circuits is selected upon calibration of the camera to compensate for internal delays within the camera with those phase shifts being stored in said control subsystem, and wherein each of said plurality of variable phase shift circuits is temperature compensated and includes:

a feedforward path having:

a voltage controlled delay circuit coupled to said oscillator to receive said clock signal and selectively delay said clock signal;

a high-frequency differential amplifier coupled to said voltage controlled delay circuit to receive a delayed clock signal and to amplify said delayed clock signal; and a differential to TTL level translator coupled to said differential amplifier to convert said amplified delayed clock signal provide to a TTL sample clock signal selectively delayed from said clock signal with said sample clock signal being disposed to be applied to an A/D converter as the clock signal; and a feedback path having:

an exclusive NOR gate having one input terminal coupled to receive said sample clock signal from said differential to TTL level translator and a second input terminal coupled to said oscillator to receive said clock signal to produce a signal that is proportional to the phase difference between said clock and sample clock signals together with the polarity of that difference;

an integrator coupled to said exclusive NOR gate to receive said difference signal to convert that difference signal to an analog signal that is proportional to a difference represented by said difference signal;

a D/A converter coupled to said control subsystem to receive a signal corresponding to said stored phase shift that corresponds to the corresponding variable phase shift circuit and to convert that phase shift signal to an analog signal; and an operational amplifier having a first input terminal coupled to receive said analog difference signal from said integrator and a second input terminal to receive said analog phase shift signal from said D/A converter with said output terminal coupled to said voltage controlled delay circuit to scale a voltage feedback signal to adjust the phase delay of said variable phase circuit; and an output interface coupled to each of said plurality of A/D converters to present said pixel bit streams that are representative of said image to a user.

11. A high speed electronic camera comprising:

a control subsystem to generate internal control signals;

an oscillator of a selected frequency to define a maximum signal frequency of the camera;

a lens assembly disposed to receive an image;

a two channel CCD array having an active image receiving area and a plurality of interactive terminals with said active image receiving area disposed to receive said image from said lens assembly and to provide first and second image data signals from each of said two channels, respectively, for each line of said image;

a plurality of vertical and horizontal image drivers coupled to corresponding ones of said interactive terminals of said two channel CCD array, said oscillator and said control subsystem to advance image charges through and from each channel of said CCD array under control of said oscillator utilizing signals received from said control subsystem;

a first A/D converter connected to said CCD array to receive said first image data signal for conversion to a first pixel bit stream;

a second A/D converter connected to said CCD array to receive said second image data signal for conversion to a second pixel bit stream;

an output interface coupled to said first and second A/D converters to present said first and second pixel bit streams that are representative of said image to a user; and a pair of anti-smearing assemblies wherein each anti-smearing assembly includes:

a first delay line coupled to said first A/D converter to hold a next previous byte of pixel data from said first A/D converter;

a second delay line coupled to said second A/D converter to hold a next previous byte of pixel data from said second A/D converter;

a first multiplier coupled to said first delay line to receive said next previous byte of pixel data from said first A/D converter to multiply a value of said next previous byte of pixel data by a first preselected fractional value to obtain a first reduced value pixel byte;

a second multiplier coupled to said second delay line to receive said next previous byte of pixel data from said second A/D converter to multiply a value of said next previous byte of pixel data by a second preselected fractional value to obtain a second reduced value pixel byte;

a first subtractor coupled to said first A/D converter to receive a latest byte of pixel data from said first A/D converter and coupled to said first multiplier to receive said first reduced value pixel byte to subtract the value of said first reduced value pixel byte from the value of said latest byte of pixel data from said first A/D converter to generate a first corrected pixel byte; and a second subtractor coupled to said second A/D converter to receive a latest byte of pixel data from said second A/D converter and coupled to said second multiplier to receive said second reduced value pixel byte to subtract the value of said second reduced value pixel byte from the value of said latest byte of pixel data from said second A/D converter to generate a second corrected pixel byte.

12. A high speed electronic camera as in claim 11 wherein said first and second preselected fractional values are substantially the same.

13. A method for use in a high speed electronic camera to process image data received with a two channel CCD array at one-quarter the pixel rate of said image data said method comprising the steps of:

a. clocking said two channel CCD array at a selected frequency to produce a data signal from each channel of said CCD array at said selected frequency with a total pixel rate provided by said CCD array being twice said selected frequency;

b. dividing said selected frequency by two to produce a signal at half the frequency of said selected frequency with each pulse of said half frequency signal having a rising edge and a falling edge, wherein said half frequency signal is one quarter the pixel rate of said image data; and c. simultaneously and independently performing an analog to digital conversion twice to each data signal from each channel of said CCD array with one of said conversions on each data signal being performed on the rising edge of said half frequency signal and the second of said conversions being performed on the falling edge of said half frequency signal to produce four pixel data signals from said image data at one-quarter the pixel rate of said image data from said CCD array.

14. A method for use in a high speed electronic camera as in claim 13 wherein:

a first channel of said two channel CCD array provides a first channel data signal of said image with said analog to digital conversion of step c. splitting said first channel data signal into a first data signal and a second data signal; and a second channel of said two channel CCD array provides a second channel data signal of said image with said analog to digital conversion of step c. splitting said second channel data signal into a third data signal and a fourth data signal;

with said first, second, third and fourth data signals providing a full demultiplexing of said two data image signals from said CCD array.

15. A method for use in a high speed electronic camera as in claim 14 wherein:

said first channel data signal is a RGRG data signal;
  said first data signal is a RED data signal;
  said second data signal is a GRN1 data signal;
  said second channel data signal is a GBGB data signal;
  said third data signal is a GRN2 data signal; and
  said fourth data signal is a BLU data signal.

16. A computer-implemented method for use with a high speed electronic camera to process image data received with a two channel CCD array at one-quarter the pixel rate of said image data, said method comprising the steps of:

a. clocking said two channel CCD array at a selected frequency to produce a data signal from each channel of said CCD array at said selected frequency with a total pixel rate provided by said CCD array being twice said selected frequency;

b. dividing said selected frequency by two to produce a half frequency signal;

c. inverting said half frequency signal of step b.; and d. simultaneously and independently performing an analog to digital conversion twice to each data signal from each channel of said CCD array with one of said conversions on each data signal being performed by said half frequency signal of step b. and the second of said conversions being performed by said inverted half frequency signal of step C. to produce four pixel data signals from said image data at one-quarter the pixel rate of said image data from said CCD array.

17. A computer-implemented method for use with a high speed electronic camera as in claim 16 wherein:

a first channel of said two channel CCD array provides; a first channel data signal of said image data with said analog to digital conversion of step d. splitting said first channel data signal into a first data signal and a second data signal; and a second channel of said two channel CCD array provides a second channel data signal of said image data with said analog to digital conversion of step d. splitting said second channel data signal into a third data signal and a fourth data signal;

with said first, second, third and fourth data signals providing a full demultiplexing of said two data image signals from said CCD array.

18. A method for use in a high speed electronic camera as in claim 17 wherein:

said first channel data signal is a RGRG data signal;
  said first data signal is a RED data signal;
  said second data signal is a GRN1 data signal;
  said second channel data signal is a GBGB data signal;
  said third data signal is a GRN2 data signal; and
  said fourth data signal is a BLU data signal.

* * * * *